(12) United States Patent
Kurita et al.

(10) Patent No.: US 10,566,219 B2
(45) Date of Patent: Feb. 18, 2020

(54) CHIP TRANSFER MEMBER, CHIP TRANSFER APPARATUS, AND CHIP TRANSFER METHOD

(71) Applicants: TOSHIBA ELECTRONIC DEVICES & STORAGE CORPORATION, Minato-ku, Tokyo (JP); AYUMI INDUSTRIES COMPANY LIMITED, Hyogo-ken (JP)

(72) Inventors: Yoichiro Kurita, Minato Tokyo (JP); Tomoyuki Abe, Himeji Hyogo (JP); Hideto Furuyama, Yokohama Kanagawa (JP)

(73) Assignee: TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 1 day.

(21) Appl. No.: 16/128,949

(22) Filed: Sep. 12, 2018

(65) Prior Publication Data

US 2019/0252219 A1    Aug. 15, 2019

(30) Foreign Application Priority Data

Feb. 14, 2018    (JP) ................... 2018-024472

(51) Int. Cl.
*B32B 43/00*    (2006.01)
*H01L 21/67*    (2006.01)
(Continued)

(52) U.S. Cl.
CPC .. *H01L 21/67132* (2013.01); *H01L 21/67144* (2013.01); *H01L 21/6836* (2013.01);
(Continued)

(58) Field of Classification Search
CPC . B32B 38/10; B32B 43/006; Y10T 156/1158; Y10T 156/1917; H01L 21/67132; H01L 21/683; H01L 21/6836
(Continued)

(56) References Cited

U.S. PATENT DOCUMENTS 5,093,877 A * 3/1992 Aita ............... A61B 18/245
                                                    385/33
6,950,385 B1 * 9/2005 Chiba ............. G11B 7/0045
                                                    369/100
(Continued)

FOREIGN PATENT DOCUMENTS

JP    6343342 A    2/1988
JP    H05032946 A    2/1993
(Continued)

OTHER PUBLICATIONS

Yoichiro Kurita, et al., "III-V/Si Chip-on-Wafer Direct Transfer Bonding Technology (CoW DTB); Process Capabilities and Bonded Structure Characterizations," 6th Electronics System-Integration Technology Conference (ESTC 2016).
(Continued)

*Primary Examiner* — Mark A Osele
*Assistant Examiner* — Nickolas R Harm
(74) *Attorney, Agent, or Firm* — Holtz, Holtz & Volek PC

(57) ABSTRACT

According to one embodiment, a chip transfer member includes a light-transmitting portion and a metal portion. The light-transmitting portion has a light incident surface, a light-emitting surface, and a side surface. The metal portion is provided at the side surface of the light-transmitting portion.

12 Claims, 11 Drawing Sheets

(51) Int. Cl.
*H01L 21/687* (2006.01)
*H01L 21/683* (2006.01)
*H01L 21/677* (2006.01)
*H01L 33/00* (2010.01)
*B32B 38/10* (2006.01)

(52) U.S. Cl.
CPC ........ *H01L 21/68778* (2013.01); *B32B 38/10* (2013.01); *B32B 43/006* (2013.01); *H01L 21/67115* (2013.01); *H01L 21/67721* (2013.01); *H01L 21/683* (2013.01); *H01L 33/0095* (2013.01); *H01L 2221/68386* (2013.01); *Y10T 156/1158* (2015.01); *Y10T 156/1917* (2015.01)

(58) Field of Classification Search
USPC .................................................. 156/712, 713
See application file for complete search history.

(56) References Cited

U.S. PATENT DOCUMENTS

| | | |
|---|---|---|
| 7,153,361 B2 | 12/2006 | Furuyama |
| 8,513,093 B2 | 8/2013 | Yonehara |
| 9,401,298 B2 | 7/2016 | Zakel et al. |
| 2003/0170946 A1 | 9/2003 | Kondo |
| 2014/0120640 A1 | 5/2014 | Shieh et al. |
| 2015/0374539 A1* | 12/2015 | Buzawa ............ A61F 9/00781 606/6 |
| 2016/0126218 A1 | 5/2016 | Kurita |
| 2017/0309594 A1 | 10/2017 | Kurita |

FOREIGN PATENT DOCUMENTS

| | | |
|---|---|---|
| JP | H08288318 A | 11/1996 |
| JP | 2003204047 A | 7/2003 |
| JP | 2008535275 A | 8/2008 |
| JP | 2012156473 A | 8/2012 |
| JP | 2014036060 A | 2/2014 |
| JP | 5590837 B2 | 9/2014 |
| JP | 2016504753 A | 2/2016 |
| JP | 2016092078 A | 5/2016 |

OTHER PUBLICATIONS

Kazuya Ohira, et al., "High-Speed and Stable Operation of Highly Unidirectional III-V/Silicon Microring Lasers for On-chip Optical Interconnects," Conference on Lasers and Electro-Optics (CLEO 2015), May 2015.

* cited by examiner

CHIP TRANSFER MEMBER, CHIP TRANSFER APPARATUS, AND CHIP TRANSFER METHOD

CROSS-REFERENCE TO RELATED APPLICATION

This application is based upon and claims the benefit of priority from Japanese Patent Application No. 2018-024472, filed on Feb. 14, 2018; the entire contents of which are incorporated herein by reference.

FIELD

Embodiments described herein relate generally to a chip transfer member, a chip transfer apparatus, and a chip transfer method.

BACKGROUND

Technology has been proposed in which plasma-activated surfaces of a chip and a substrate are directly bonded to each other. The chip is bonded to a sheet before being transferred to the substrate. By irradiating UV (ultraviolet) light onto a bonding layer of the sheet, the bonding layer is cured; the bonding force between the chip and the sheet is reduced; and the chip is transferred from the sheet to the substrate.

DETAILED DESCRIPTION

Figure 1:
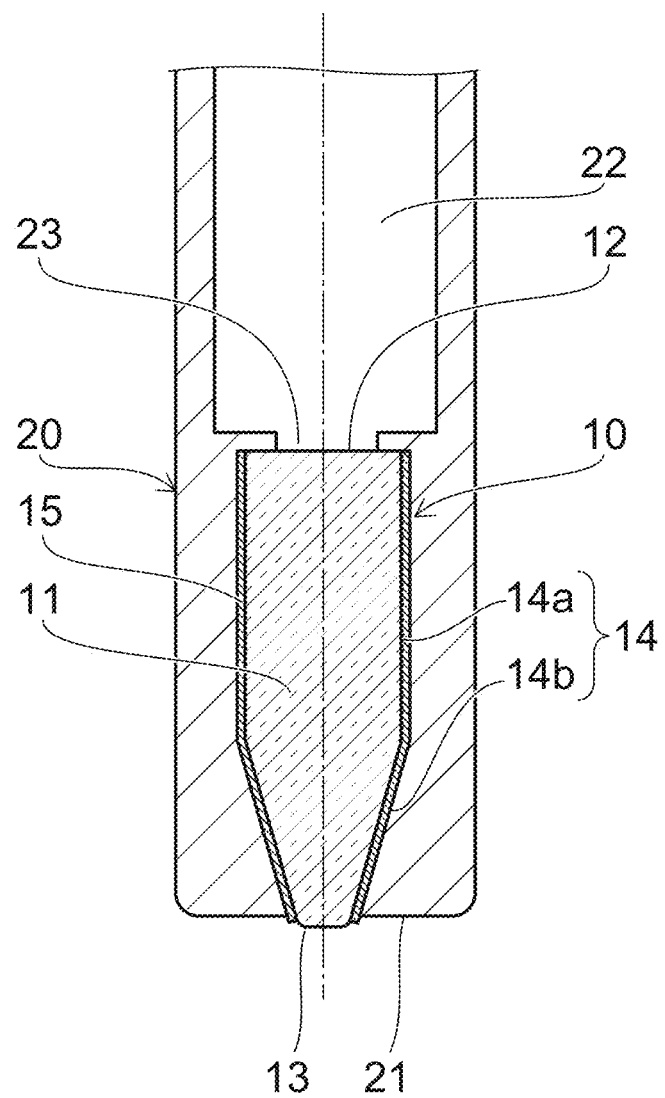
FIG. 1 is a schematic cross-sectional view of a chip transfer apparatus of an embodiment.

According to one embodiment, a chip transfer member includes a light-transmitting portion and a metal portion. The light-transmitting portion has a light incident surface, a light-emitting surface, and a side surface. The metal portion is provided at the side surface of the light-transmitting portion.

Embodiments of the invention provide a chip transfer member, a chip transfer apparatus, and a chip transfer method in which selective light irradiation of a chip which is the transfer object is possible.

Embodiments will now be described with reference to the drawings. The same components in the drawings are marked with the same reference numerals.

FIG. 1 is a schematic cross-sectional view of a chip transfer apparatus of an embodiment.

The chip transfer apparatus of the embodiment includes a chip transfer member 10, and a holding member 20 that holds the chip transfer member 10. The chip transfer apparatus further includes a substrate stage 91, a sheet stage 92, and a suction mechanism 93 shown in FIGS. 5A and 5B. The suction mechanism 93 is, for example, a vacuum-attach mechanism.

The chip transfer member 10 includes a light-transmitting portion 11 made of, for example, a glass material. The light-transmitting portion 11 has a light incident surface 12, a light-emitting surface 13, and a side surface 14.

The direction from the light incident surface 12 toward the light-emitting surface 13 is aligned with a first direction. The optical axis of the light-transmitting portion 11 is illustrated by a single dot-dash line. The optical axis connects the center of the light incident surface 12 and the center of the light-emitting surface 13. The first direction is parallel to the optical axis.

The side surface 14 of the light-transmitting portion 11 includes a first side surface portion 14a and a second side surface portion 14b. The first side surface portion 14a forms a right angle with the light incident surface 12 and extends parallel to the optical axis. The second side surface portion 14b forms an obtuse angle with the light-emitting surface 13 and is tilted with respect to the optical axis and the light-emitting surface 13.

A metal portion 15 is provided at the side surface 14 of the light-transmitting portion 11. The metal portion 15 is a metal film coated onto the side surface 14. The metal film includes, for example, an aluminum film.

The metal portion 15 covers the entire side surface 14 of the light-transmitting portion 11. The metal portion 15 is not provided at the light incident surface 12 or the light-emitting surface 13. For example, after coating the metal film onto the entire surface (the light incident surface 12, the light-emitting surface 13, and the side surface 14) of the light-transmitting portion 11, the metal film that is formed at the light incident surface 12 and the light-emitting surface 13 is removed by polishing.

Figure 2A:
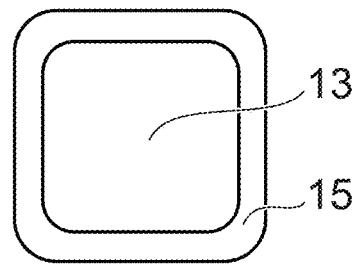
FIGS. 2A and 2B are plan view of a light-emitting surface of a chip transfer member of the embodiment.

FIG. 2A is a plan view of the light-emitting surface 13 of the chip transfer member 10.

Figure 2B:
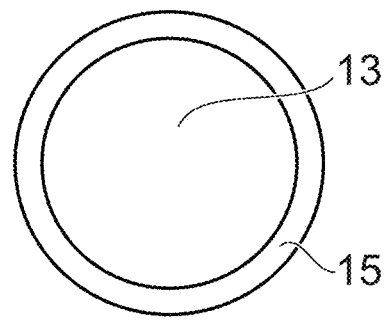

As described below, the light-emitting surface 13 is a surface that presses the chip. The configuration of the light-emitting surface 13 is substantially a quadrilateral having four corners matching the quadrilateral planar configuration of the chip. The corners of the light-emitting surface 13 may be right angles or rounded. Or, as shown in FIG. 2B, the configuration of the light-emitting surface 13 may be a circle.

The light can be irradiated without causing an unirradiated region in the bonding surface between the chip and the carrier sheet described below by setting the configuration of the light-emitting surface 13 to be substantially a quadrilateral similar to the chip configuration. Further, the light irradiation on unnecessary regions other than the object chip can be suppressed.

As shown in FIG. 1, the holding member 20 includes a light guide portion 22 communicating with the light incident surface 12 of the light-transmitting portion 11. The light guide portion 22 is a hollow, or a light guide member inserted into a hollow. An opening 23 is formed between the light guide portion 22 and the light incident surface 12.

The holding member 20 holds the chip transfer member 10 and functions as an adapter for the light source side. Together with the holding member 20, the chip transfer member 10 can be lifted and lowered (moved along the optical-axis direction) and moved horizontally (moved in a direction orthogonal to the optical axis).

The light that is emitted from a not-illustrated light source passes through the light guide portion 22 and the opening 23 and is incident on the light incident surface 12 of the light-transmitting portion 11. The light that is incident on the light incident surface 12 travels through the light-transmitting portion 11 toward the light-emitting surface 13 and is emitted from the light-emitting surface 13.

The light-emitting surface 13 of the chip transfer member 10 protrudes more than a tip 21 of the holding member 20. A portion of the second side surface portion 14b of the light-transmitting portion 11 also protrudes more than the tip of the holding member 20; and the portion (the protrusion) of the second side surface portion 14b is covered with the metal portion 15. The metal portion 15 shields the transmission of light. Accordingly, the emission region (area) of the light substantially can be limited to the light-emitting surface 13.

Figure 7:
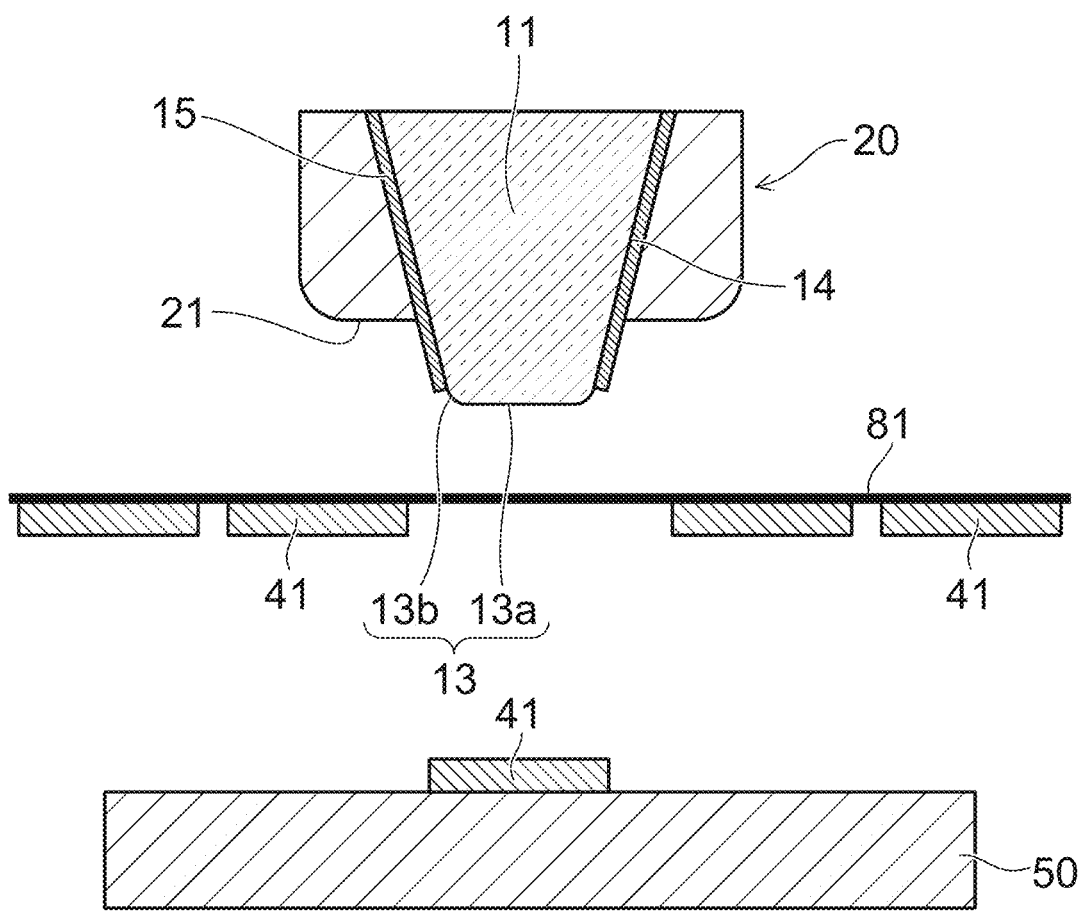

As shown in FIG. 7, the light-emitting surface 13 includes a flat surface 13a, and a curved surface (or a tilted surface) 13b provided between the flat surface 13a and the side surface 14. The curved surface (or the tilted surface) 13b is continuous with the flat surface 13a and the side surface 14. The metal portion 15 is not provided at the curved surface (or the tilted surface) 13b.

A chip transfer method of the embodiment will now be described with reference to FIG. 3A to FIG. 7.

Figure 3A:
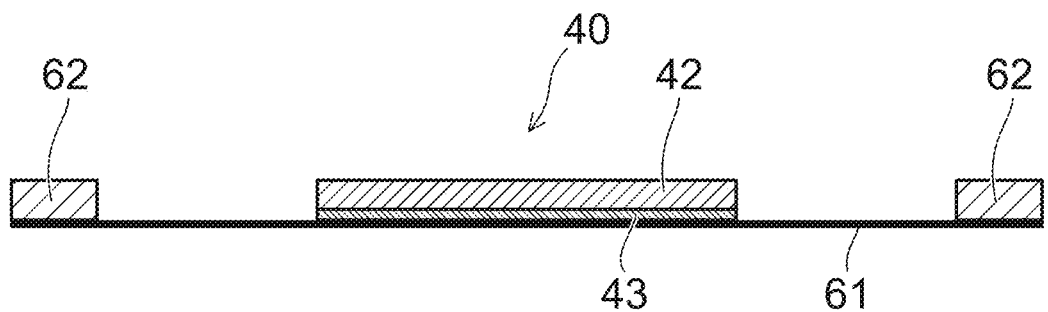
FIGS. 3A to 3D are schematic cross-sectional views showing the chip transfer method of the embodiment.

As shown in FIG. 3A, a wafer 40 is adhered to a dicing sheet 61. The dicing sheet 61 is fixed to a ring frame 62 having a ring configuration and is stretched on the inner side of the ring frame 62.

The wafer 40 includes, for example, a semiconductor substrate 42 and a semiconductor layer 43. A surface of the semiconductor layer 43 is adhered to the dicing sheet 61. The semiconductor layer 43 includes, for example, a compound semiconductor layer. The semiconductor layer 43 includes, for example, a Group III-V semiconductor layer epitaxially grown on the semiconductor substrate 42.

Figure 3B:
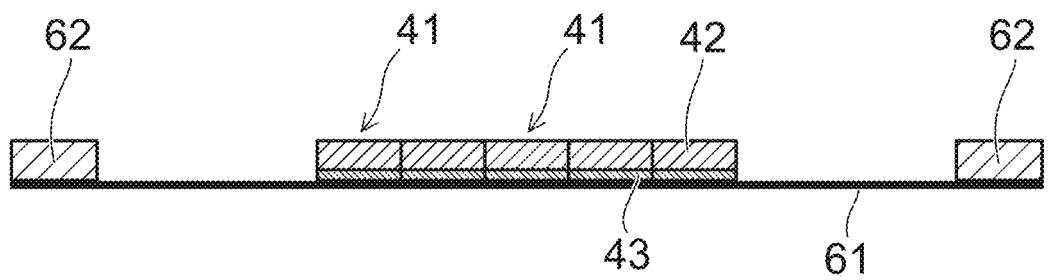

The wafer 40 is diced on the dicing sheet 61 and is singulated into multiple chips 41 as shown in FIG. 3B.

Figure 3C:
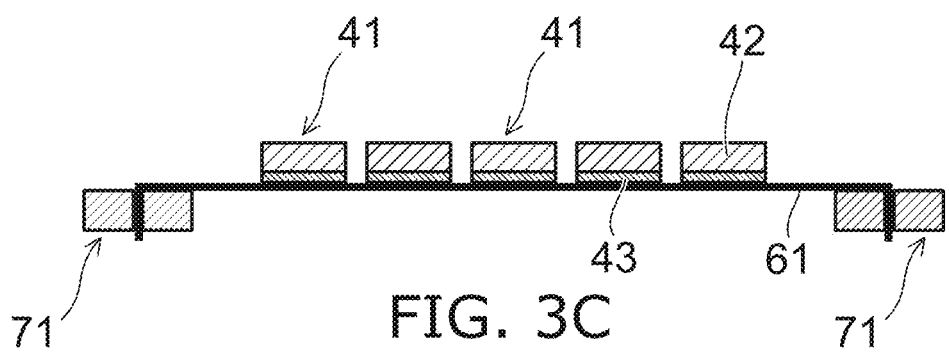

Then, the dicing sheet 61 is detached from the ring frame 62; and as shown in FIG. 3C, the dicing sheet 61 is set in an expanding apparatus 71 and expanded by pulling the dicing sheet 61. The spacing of the multiple chips 41 adhered to the dicing sheet 61 is widened.

Figure 3D:
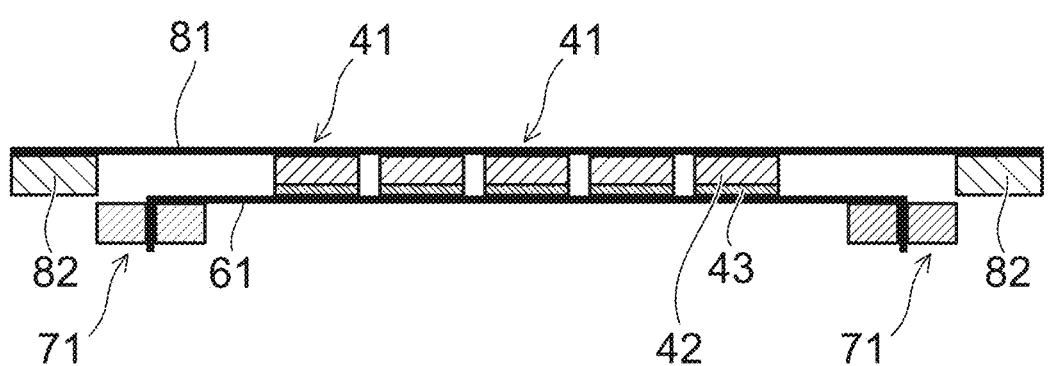

Subsequently, as shown in FIG. 3D, the multiple chips 41 are transferred collectively to a carrier sheet 81. The carrier sheet 81 is fixed to a ring frame 82 having a ring configuration and is stretched on the inner side of the ring frame 82.

The carrier sheet 81 is formed of a light-transmissive transparent resin; and, for example, a UV-curing bonding layer is formed on a surface of the carrier sheet 81. The semiconductor substrate 42 of the chip 41 is adhered to the bonding layer of the carrier sheet 81.

Figure 4A:
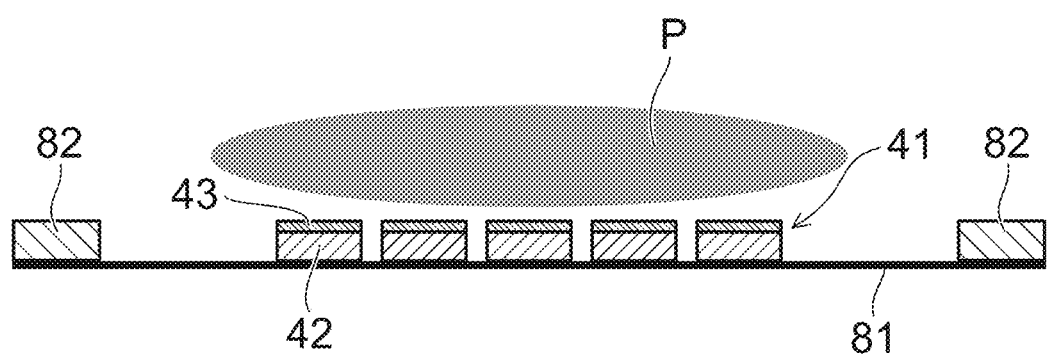
FIG. 4A to FIG. 7 are schematic cross-sectional views showing the chip transfer method of the embodiment.

Then, as shown in FIG. 4A, the surfaces of the semiconductor layers 43 of the multiple chips 41 adhered to the carrier sheet 81 are exposed to plasma (e.g., $O_2$ plasma). Contaminants such as organic substances, etc., adhered to the surfaces of the semiconductor layers 43 can be removed; and the surfaces of the semiconductor layers 43 can be terminated using, for example, a hydroxide group.

Figure 4B:
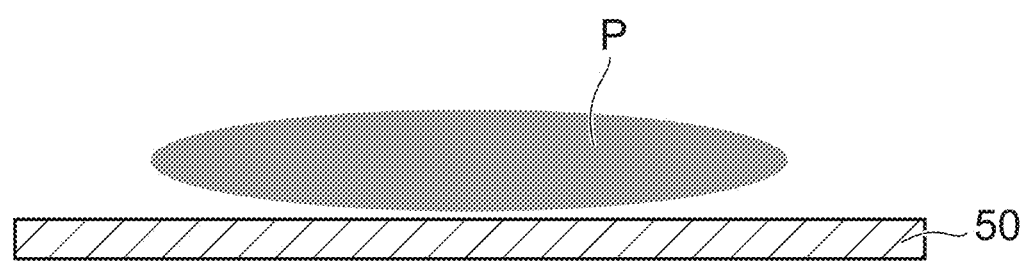

According to the embodiment, for example, the semiconductor layers 43 of the chips 41 including the Group III-V semiconductor are bonded to the silicon substrate. As shown in FIG. 4B, the surface of a substrate 50 to which the chips 41 are transferred also is exposed to plasma (e.g., $O_2$ plasma). Contaminants such as organic substances, etc., adhered to the surface of the substrate 50 can be removed; and the surface of the substrate 50 can be terminated using, for example, a hydroxide group. The substrate 50 may be a semiconductor substrate or a glass substrate other than silicon. Also, the chips 41 may be silicon chips or glass chips.

Figure 5A:
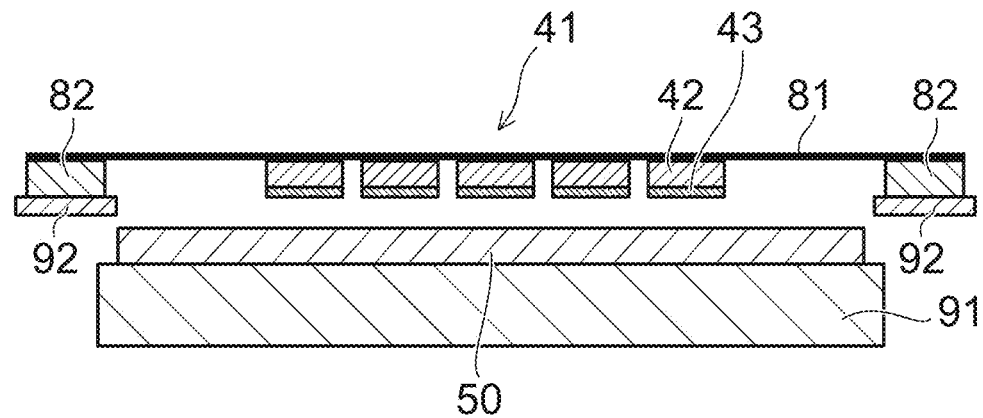

As shown in FIG. 5A, the plasma-activated surfaces of the chips 41 adhered to the carrier sheet 81 are disposed to oppose the plasma-activated surface of the substrate 50. The substrate 50 is held on the substrate stage 91; and the ring frame 82 that fixes the carrier sheet 81 is held on the sheet stage 92 having the ring configuration.

Figure 5B:
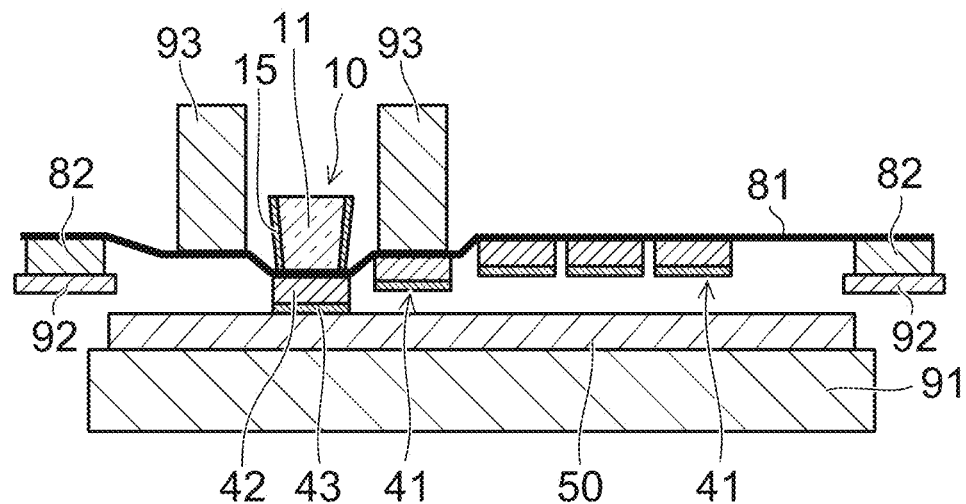

Then, as shown in FIG. 5B, a not-illustrated lifting/lowering mechanism (or pressing mechanism) moves the chip transfer member 10 toward the chip 41 which is the transfer object. The chip transfer member 10 presses the chip 41 which is the transfer object through the carrier sheet 81 and causes the activated surface of the chip 41 to closely adhere to the activated surface of the substrate 50. This is performed at room temperature.

At this time, the sheet stage 92 is lifted in a direction away from the substrate 50; the edge portion of the carrier sheet 81 is lifted; and the carrier sheet 81 is pulled. Further, the suction mechanism 93 that has a ring configuration attracts and holds the region of the carrier sheet 81 at the periphery of the transfer object chip. Thereby, flexing of the region of the carrier sheet 81 to be pressed is controlled; and the other chips 41 that are not the transfer object are separated from the substrate 50.

By setting the tip portion of the chip transfer member 10 including the light-emitting surface 13 (the pressing surface) to protrude from the tip 21 of the holding member 20, it is easy to ensure the clearance between the carrier sheet 81 and the tip 21 of the holding member 20 to permit the tilt of the carrier sheet 81.

Figure 6A:
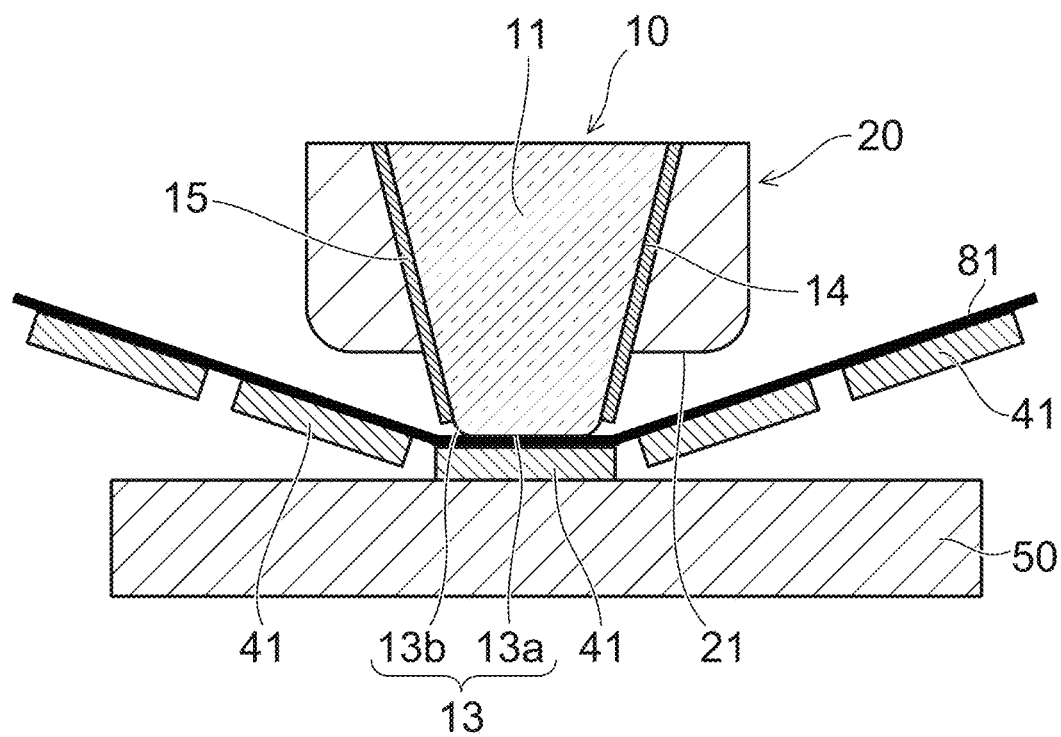

FIG. 6A is an enlarged view of the chip pressing portion using the chip transfer member 10. The holding member 20 and the suction mechanism 93 are not illustrated.

Figure 6B:
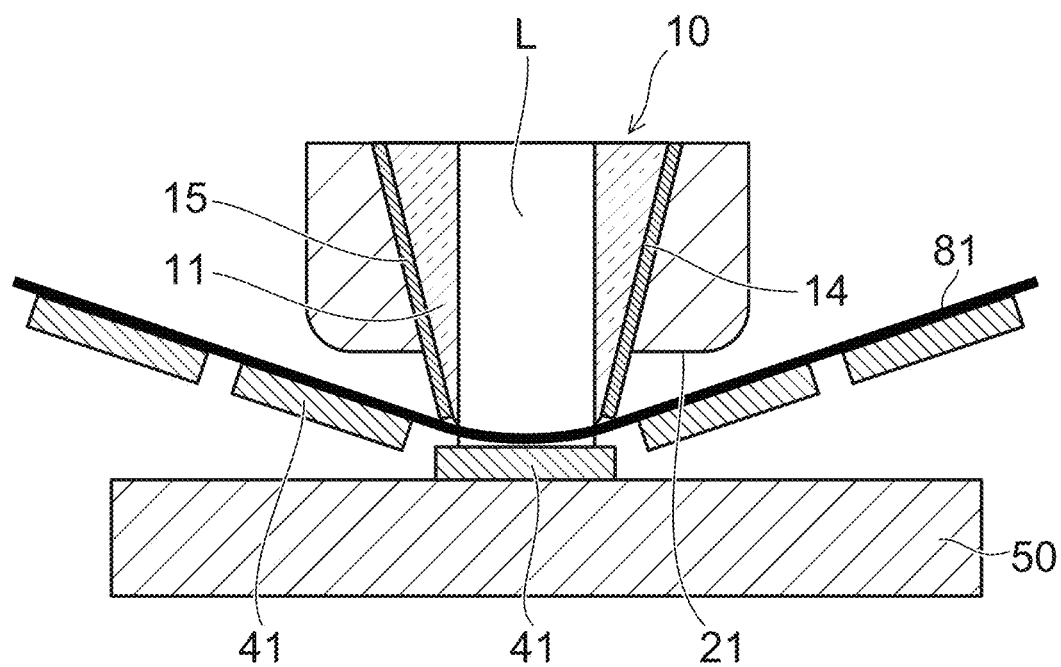

The light-emitting surface 13 of the chip transfer member 10 presses, through the carrier sheet 81, the chip 41 which is the transfer object to the substrate 50; and the chip 41 is bonded to the substrate 50. For example, UV light L is irradiated on the carrier sheet 81 through the light-transmitting portion 11 of the chip transfer member 10 in this state as shown in FIG. 6B.

The bonding layer of the carrier sheet 81 is cured by the irradiation of the UV light L; and the bonding force between the carrier sheet 81 and the chip 41 which is the transfer object decreases. The chip 41 that has the reduced bonding force to the carrier sheet 81 is peeled from the carrier sheet 81 and transferred to the substrate 50 as shown in FIG. 7. The chip 41 is temporarily bonded to the substrate 50 at room temperature by using plasma to activate the surface of the chip 41 and the surface of the substrate 50 and by closely adhering the chip 41 to the substrate 50.

The pressing by the chip transfer member 10 and the UV light irradiation are repeated for the other chips 41; and the multiple chips 41 are transferred to the substrate 50.

Figure 5C:
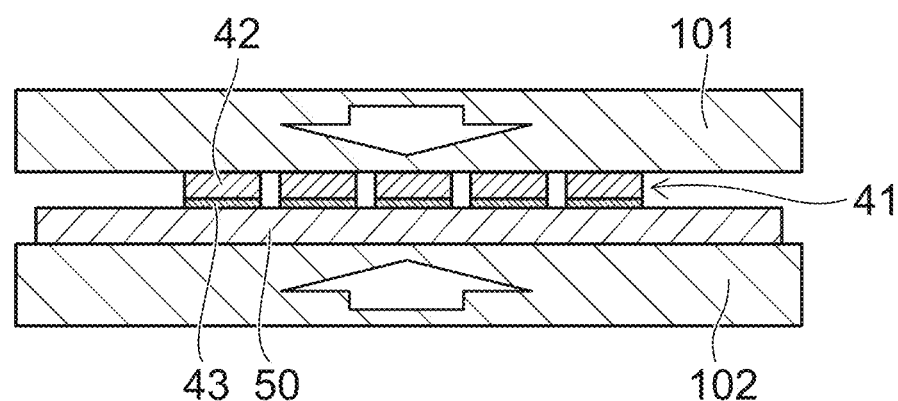

After transferring the multiple chips 41 from the carrier sheet 81 to the substrate 50, the multiple chips 41 and the substrate 50 are pressed between hotplates 101 and 102 and heated as shown in FIG. 5C. The closely-adhered portions of the activated surface of the substrate 50 and the activated surfaces of the chips 41 are heated. The main bonding of the multiple chips 41 to the substrate 50 is performed. The bonding positions of the chips 41 on the substrate 50 are substantially fixed by the temporary bonding using the chip transfer member 10 recited above; and the bonding alignment precision of the multiple chips 41 in the main bonding can be improved easily.

Figure 11:
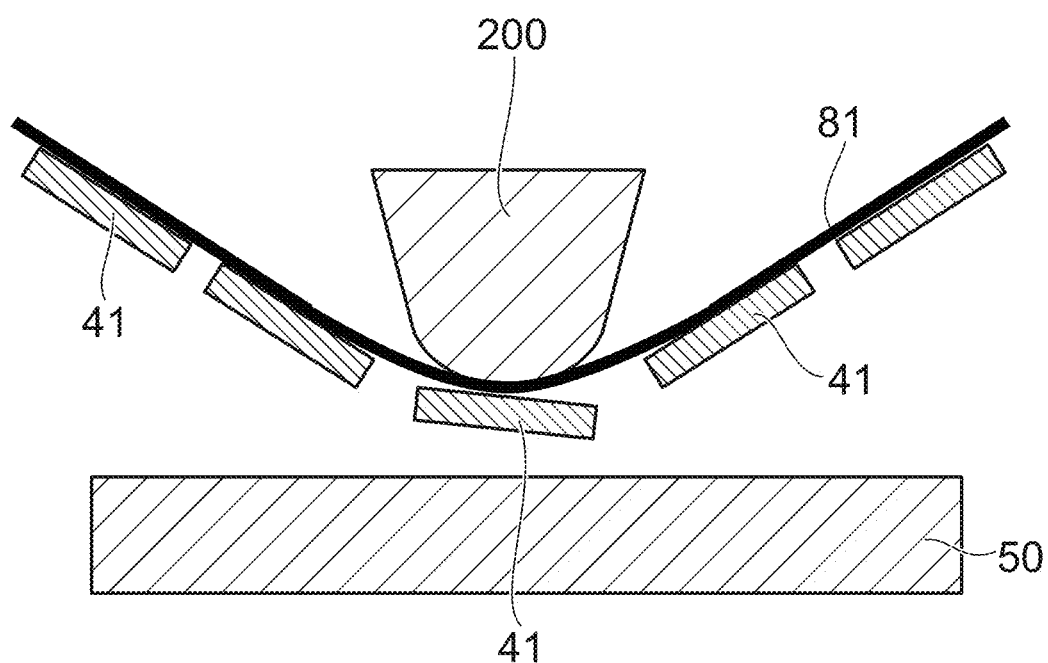
FIG. 11 is a schematic cross-sectional view showing a chip transfer method of a comparative example.

FIG. 11 is a schematic cross-sectional view showing a chip transfer method of a comparative example.

In the comparative example, the multiple chips 41 are transferred to the carrier sheet 81 in the process of FIG. 3D described above; subsequently, UV light is irradiated on the carrier sheet 81; and the bonding force between the carrier sheet 81 and the multiple chips 41 is reduced collectively beforehand. Subsequently, similarly to the embodiment, the process of FIG. 4A and the subsequent processes are performed; and the UV light irradiation on the carrier sheet 81 is not performed when transferring the chips 41 onto the substrate 50 as shown in FIG. 11.

The chip 41 which is the transfer object is pressed toward the substrate 50 by a chip transfer member 200. The bonding force between the carrier sheet 81 and the chips 41 already has been reduced before this process; therefore, the chip 41 that is pressed by the chip transfer member 200 may start to peel from the carrier sheet 81 before the chip 41 contacts the substrate 50. This may cause tilting of the chip 41 and may reduce the placement positional precision of the chip 41 on the substrate 50.

Also, the deformation of the carrier sheet 81 curving to have an apex at the location of the pressing by the chip transfer member 200 may cause the other chips proximal to the transfer object chip to start peeling. The likelihood of undesired detachment from the carrier sheet 81 of the chips 41 in subsequent processes increases.

Also, there is a risk that the carrier sheet 81 that is cured by irradiating the UV light in a wide area of the carrier sheet 81 including the multiple chips 41 in the process of FIG. 3D may undesirably undergo plastic deformation due to deformation such as that shown in FIG. 11; and the positional precision of the subsequent transfer of the chips may be affected.

Conversely, according to the embodiment, the chip 41 which is the transfer object does not peel from the carrier sheet 81 until the chip 41 contacts the substrate 50 as shown in FIG. 6A; therefore, the parallelism of the chip 41 is maintained; and the placement positional precision on the substrate 50 can be high.

The UV light L is irradiated locally through the light-transmitting portion 11 of the chip transfer member 10 as shown in FIG. 6B in the state in which the chip 41 is pressed onto the substrate 50 by the chip transfer member 10.

The leakage of the UV light from the side surface 14 of the light-transmitting portion 11 is suppressed by the metal portion 15. The bonding force to the carrier sheet 81 can be reduced only for the chip 41 which is the transfer object. The light is emitted also from the curved surface (or the tilted surface) 13b on the tip side of the light-transmitting portion 11; thereby, the chip 41 starts to peel from the carrier sheet 81 also at this portion where the light is emitted. The UV light is not incident on the region of the carrier sheet 81 where the other chips 41 that are not the transfer object are adhered; the bonding force of the other chips 41 to the carrier sheet 81 is maintained; and the detachment of the chips 41 in subsequent processes can be prevented.

The UV-cured region of the carrier sheet 81 can be a minimum. This suppresses a large plastic deformation of the carrier sheet 81 and stabilizes the process of continuously transferring the multiple chips 41 onto the substrate 50.

Figure 10A:
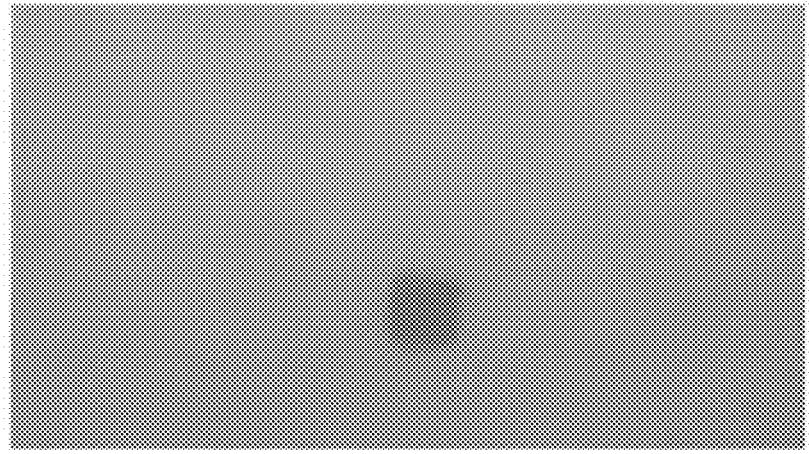
FIG. 10A is a photograph of an ultraviolet light intensity distribution measurement film (a UV scale) on which UV light is irradiated using the chip transfer member of the embodiment.

FIG. 10A is a photograph of an ultraviolet light intensity distribution measurement film (a UV scale) on which UV light is irradiated using the chip transfer member 10 of the embodiment. The UV scale enables visualization of the light intensity distribution of the UV light by the color density of the film; and the region where the UV light is incident has a dark discoloration.

Because the metal portion 15 suppresses the leakage of the UV light from the side surface 14 of the light-transmitting portion 11, the UV light is contained in the desired irradiation area for the quadrilateral configuration of the chip as shown in FIG. 10A. The fluctuation of the cumulative light intensity distribution inside the UV light irradiation region also can be suppressed; and it is possible to peel the entire surface of the chip from the carrier sheet at a uniform timing.

Figure 10B:
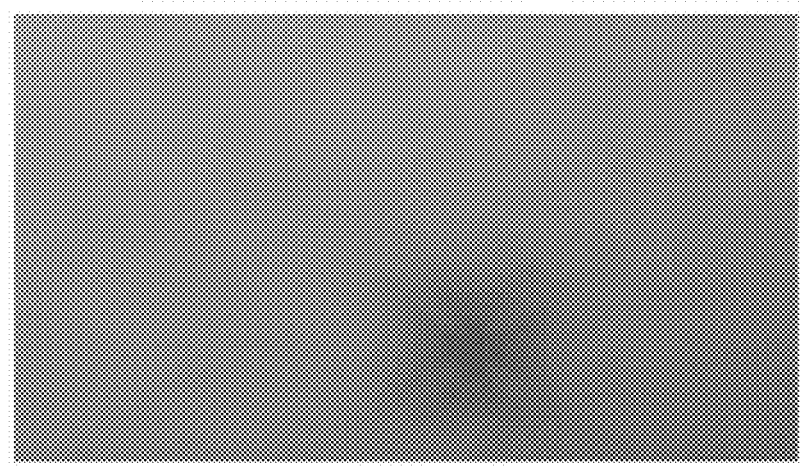
FIG. 10B is a photograph of a UV scale in which the UV light is irradiated using a chip transfer member including only a light-transmitting portion not having a metal portion provided at a side surface.

FIG. 10B is a photograph of a UV scale in which the UV light is irradiated using a light-transmitting portion 11 in which the metal portion 15 is not provided.

As shown in FIG. 10B, the shape and the area of the irradiation region of the UV light are unstable in the case where light shielding of the side surface of the light-transmitting portion 11 is not provided. In such a case, the chip easily starts to peel from undesignated locations, which affects the chip placement positional precision on the substrate. Also, there is a risk that the carrier sheet may be undesirably damaged by excessive local irradiation of the UV light.

By setting the pressing surface of the chip transfer member 10 for the chip 41 to be the flat surface 13a, the chip 41 is maintained in a state of being parallel to the substrate 50 without tilting when pressing.

Figure 8A:
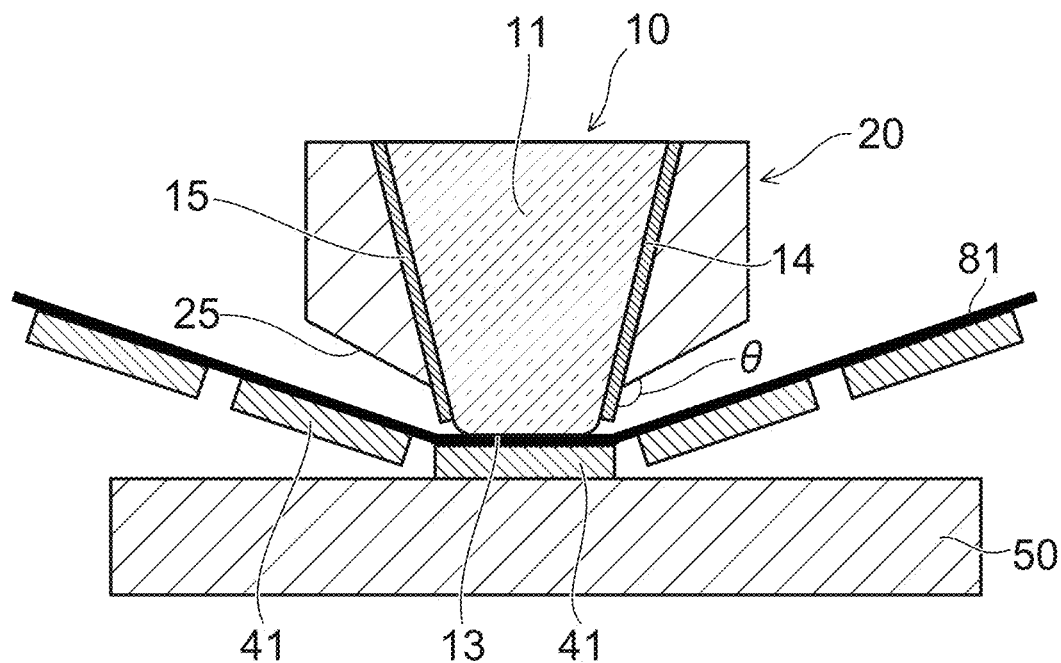
FIGS. 8A and 8B are schematic cross-sectional views of a chip transfer apparatus of the embodiment.

FIG. 8A is a schematic cross-sectional view showing another example of the chip transfer apparatus of the embodiment.

In the example shown in FIG. 8A, the tip of the holding member 20 has a tilted surface 25 that is tilted with respect to the light-emitting surface 13 of the light-transmitting portion 11. An angle θ between the tilted surface 25 and the side surface 14 of the light-transmitting portion 11 is greater than 90° but less than 180°.

In other words, the tilted surface 25 of the tip of the holding member 20 is tilted along the tilt of the carrier sheet 81 that is separated from the substrate 50 while being tilted in the state in which the object chip 41 is pressed onto the substrate 50. Therefore, it is easy to ensure the movement amount of the carrier sheet 81 upward to separate, from the substrate 50, the chips 41 proximal to the transfer object chip 41; and the chips 41 that are not the transfer object can be separated reliably from the substrate 50.

Figure 8B:
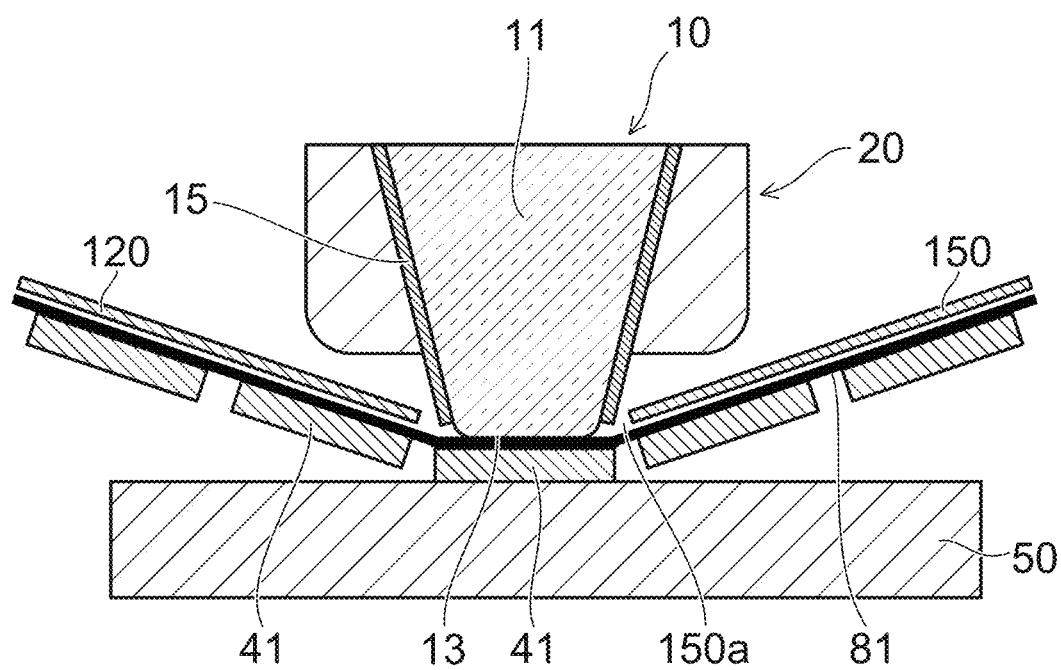

FIG. 8B is a schematic cross-sectional view showing another example of the chip transfer apparatus of the embodiment.

In the example shown in FIG. 8B, a metal plate 150 is disposed to oppose the surface of the carrier sheet 81 opposite to the surface where the chips 41 are adhered. An opening 150a is formed in a portion of the metal plate 150; and the chip transfer member 10 can press the chip 41 which is the transfer object through the carrier sheet 81 and through the opening 150a.

The metal plate 150 shields the irradiation of the light on the other chips 41 that are not the transfer object and on the region of the carrier sheet 81 where the other chips 41 are adhered. The light that is undesirably irradiated on regions can be suppressed reliably by the metal plate 150.

Figure 9A:
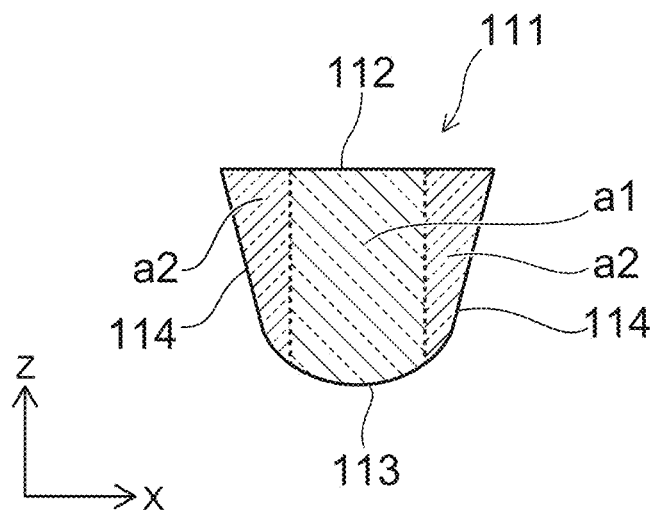
FIGS. 9A and 9B are schematic cross-sectional views of a chip transfer member of the embodiment.

FIG. 9A is a schematic cross-sectional view of another example of the chip transfer member of the embodiment.

The chip transfer member shown in FIG. 9A includes a light-transmitting portion 111 made of, for example, a glass material similar to that of the chip transfer member 10 described above. The light-transmitting portion 111 has a light incident surface 112 and a light-emitting surface 113.

The direction from the light incident surface 112 toward the light-emitting surface 113 is aligned with the first direction (a Z-axis direction). The first direction is parallel to the optical axis of the light-transmitting portion 111 connecting the center of the light incident surface 112 and the center of the light-emitting surface 113.

The light-transmitting portion 111 further includes multiple regions a1 and a2 having different refractive indexes distributed along a second direction crossing the first direction (the Z-axis direction). In the example, the second direction is aligned with an X-axis direction orthogonal to the Z-axis direction.

The region a1 is provided between the region a2 along the second direction. For example, the region a1 is provided in a columnar configuration in a region including the optical axis of the light-transmitting portion 111; and the region a2 is provided to surround the region a1.

The refractive index of the region a1 is higher than the refractive index of the region a2. Accordingly, the light that is incident on the light incident surface 112 is guided through the light-transmitting portion 111 in a state of being trapped in the region a1 by total internal reflection and is emitted from the light-emitting surface 113. The leakage of the light from a side surface 114 can be suppressed even without providing a metal portion on the side surface 114.

By setting the light-emitting surface 113 to have a lens configuration having a curvature, the diffusion of the light is suppressed; and it is easy to concentrate the light in the desired region.

Figure 9B:
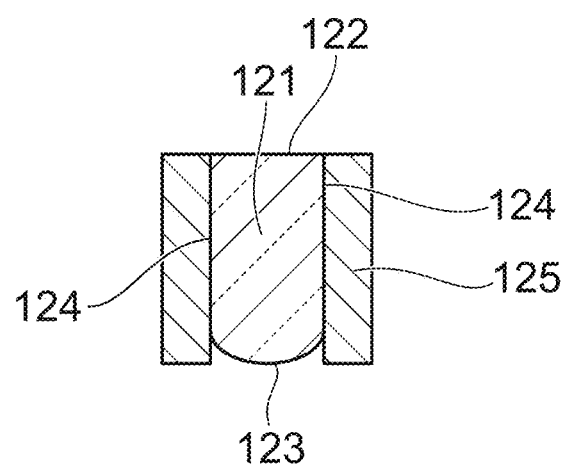

FIG. 9B is a schematic cross-sectional view of another example of the chip transfer member of the embodiment.

The chip transfer member shown in FIG. 9B includes a light-transmitting portion 121 made of, for example, a glass material similar to that of the chip transfer member 10 described above. The light-transmitting portion 121 has a light incident surface 122 and a light-emitting surface 123.

In the example as well, a metal portion 125 covers a side surface 124 of the light-transmitting portion 121. The metal portion 125 is a metal capillary; and the light-transmitting portion 121 is held inside the metal capillary.

By the suction mechanism 93 attracting and holding the region of the carrier sheet 81 at the periphery of the transfer object chip, compared to the case where the attracting and holding is not performed, the tension in the sheet surface at the periphery of the pressing portion is uniform; and the lift amount of the carrier sheet 81 is small and stable.

In the case where the lift amount of the carrier sheet 81 is small, the other chips 41 that are not the transfer object are easily positioned proximally to the light-transmitting portion 11 of the chip transfer member 10; and the likelihood of light irradiation on the other chips 41 is high. Even for such circumstances, according to the embodiment, the light leakage from the side surface of the chip transfer member can be suppressed by the light-transmitting portion 111 in which the refractive index distribution is controlled, the metal portion 15, the metal portion 125, or the metal plate 150 described above; therefore, the irradiation of the light on the other chips 41 can be suppressed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A chip transfer apparatus, comprising:
    a chip transfer member including (i) a light-transmitting portion having a light incident surface, a light-emitting surface, and a side surface, and (ii) a metal portion provided at the side surface; and
    a holding member including a light guide portion and holding the chip transfer member, the light guide portion communicating with the light incident surface,
    wherein:
    the light-emitting surface and a portion of the side surface protrude past a tip of the holding member, and
    the protruding portion of the side surface is covered by the metal portion.

2. The apparatus according to claim 1, wherein the light-emitting surface includes:
    a flat surface; and
    a curved surface or a tilted surface, the curved surface or the tilted surface being provided between the flat surface and the side surface.

3. The apparatus according to claim 2, wherein the metal portion is not provided at the curved surface or the tilted surface.

4. The apparatus according to claim 1, wherein a configuration of the light-emitting surface is substantially a quadrilateral having four corners.

5. The apparatus according to claim 1, wherein:
    the tip of the holding member has a tilted surface that is tilted with respect to the light-emitting surface, and
    an angle between the tilted surface and the side surface of the light-transmitting portion is greater than 90° but less than 180°.

6. The apparatus according to claim 1, wherein the side surface of the light-transmitting portion of the chip transfer member is tilted with respect to the light incident surface and the light-emitting surface.

7. A chip transfer method, comprising:
    causing a surface of a chip and a surface of a substrate to oppose each other, the chip being adhered to a sheet, the surface of the chip being activated, and the surface of the substrate being activated;
    closely adhering the activated surface of the chip to the activated surface of the substrate by using a chip transfer member to press the chip through the sheet; and
    peeling the sheet from the chip by irradiating light through the chip transfer member onto the sheet while maintaining a state in which the activated surface of the chip is closely adhered to the activated surface of the substrate,
    wherein:
    the chip transfer member includes (i) a light-transmitting portion having a light incident surface, a light-emitting surface, and a side surface, and a metal portion provided at the side surface,
    the chip transfer member is held by a holding member including a light guide portion, the light guide portion communicating with the light incident surface,
    the light-emitting surface and a portion of the side surface protrude past a tip of the holding member, and the protruding portion of the side surface is covered by the metal portion.

8. The method according to claim 7, wherein UV light is irradiated on the sheet through the chip transfer member.

9. The method according to claim 7, wherein a region of the sheet at a periphery of a portion pressed by the chip transfer member is attracted and held.

10. The method according to claim 7, further comprising heating a closely-adhered portion of the activated surface of the chip and the activated surface of the substrate after the peeling of the sheet from the chip.

11. A chip transfer apparatus, comprising:
- a chip transfer member including (i) a light-transmitting portion having a light incident surface, a light-emitting surface, and a side surface, and (ii) a metal portion provided at the side surface;
- a holding member including a light guide portion and holding the chip transfer member, the light guide portion communicating with the light incident surface; and
- a substrate stage,
- wherein the chip transfer member is configured to press the substrate stage by relative movement of the holding member and the substrate stage.

12. The apparatus according to claim 11, wherein the light-emitting surface and a portion of the side surface protrude past a tip of the holding member, and the protruding portion of the side surface is covered by the metal portion.

\* \* \* \* \*